United States Patent
Fournel et al.

(10) Patent No.: US 7,229,897 B2
(45) Date of Patent: Jun. 12, 2007

(54) METHOD FOR PRODUCING A STACKED STRUCTURE

(75) Inventors: Franck Fournel, Moirans (FR); Hubert Moriceau, Saint-Egreve (FR); Marc Zussy, Grenoble (FR); Noel Magnea, Moirans (FR)

(73) Assignee: Commissariat a l'Energie Atomique, Paris (FR)

( * ) Notice: Subject to any disclaimer, the term of this patent is extended or adjusted under 35 U.S.C. 154(b) by 551 days.

(21) Appl. No.: 10/450,528

(22) PCT Filed: Dec. 27, 2001

(86) PCT No.: PCT/FR01/04130

§ 371 (c)(1),
(2), (4) Date: Jun. 20, 2003

(87) PCT Pub. No.: WO02/054466

PCT Pub. Date: Jul. 11, 2002

(65) Prior Publication Data

US 2005/0101095 A1   May 12, 2005

(30) Foreign Application Priority Data

Dec. 28, 2000  (FR)  .................................. 00 17215

(51) Int. Cl.
*H01L 21/30* (2006.01)
(52) U.S. Cl. ...................... 438/455; 438/458; 438/459; 438/460
(58) Field of Classification Search ................ 438/455, 438/150, 97, 458, 166, 33, 168, 459, 460
See application file for complete search history.

(56) References Cited

U.S. PATENT DOCUMENTS

| 5,661,316 A | * | 8/1997 | Kish et al. ................ 257/190 |
| 5,783,477 A | * | 7/1998 | Kish et al. ................ 438/455 |
| 6,010,579 A | | 1/2000 | Henley et al. |

FOREIGN PATENT DOCUMENTS

| EP | 0 460 437 | 12/1991 |
| EP | 0460437 | * 12/1991 |

OTHER PUBLICATIONS

Y-F Chou et al.: "Angular alignment for wafer bonding" Proceedings of the SPIE, vol. 2879, pp. 291-297 Oct. 14, 1996.

* cited by examiner

*Primary Examiner*—Thao P. Le
(74) *Attorney, Agent, or Firm*—Oblon, Spivak, McClelland, Maier & Neustadt, P.C.

(57) ABSTRACT

Method for producing a stacked structure by obtaining at least two crystalline parts by detaching them from a same initial structure, each crystalline part having one face created by the detachment having a tilt angle with a reference crystalline plane of the initial structure. Structures are formed from the crystalline parts, each structure having a face to be assembled that has a controlled tilt angle in relation to the tilt angle of the created face of the corresponding crystalline part. The structures are assembled while controlling their relative positions, rotating in an interface plane, in relation to relative positions of respective crystalline parts within the initial structure, to obtain a controlled resulting tilt angle at the interface between the structures. The method may find application particularly in microelectronics, optics, and optoelectronics.

29 Claims, 8 Drawing Sheets

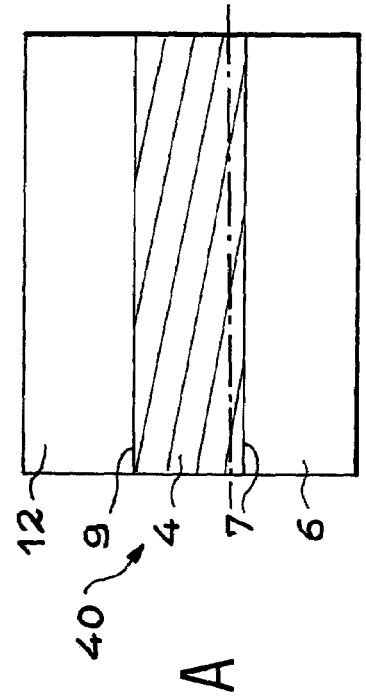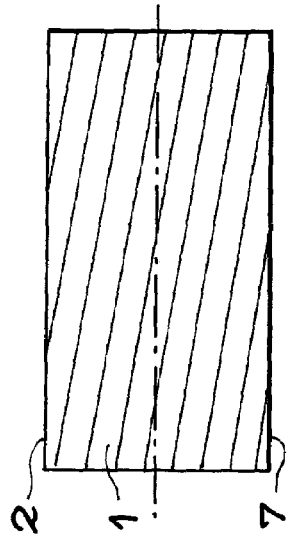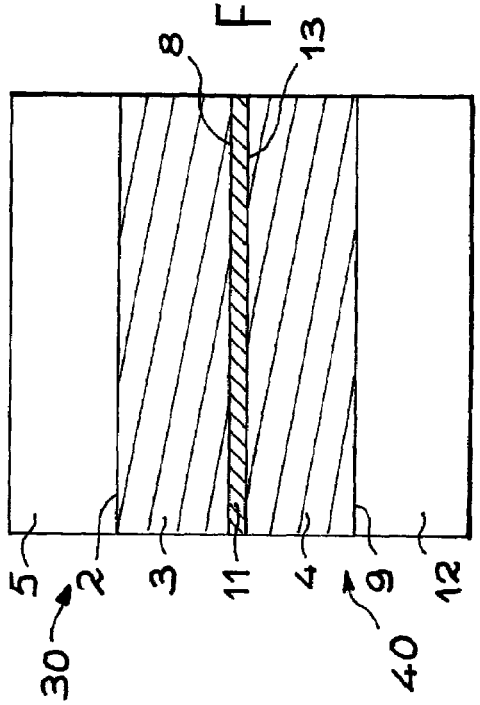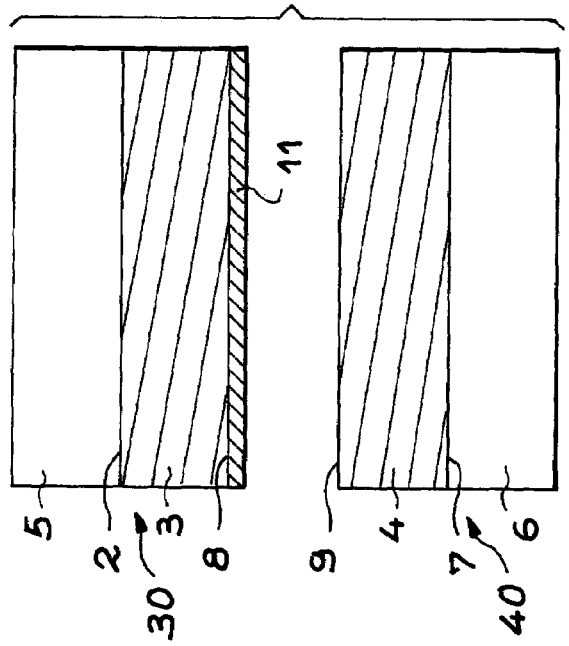

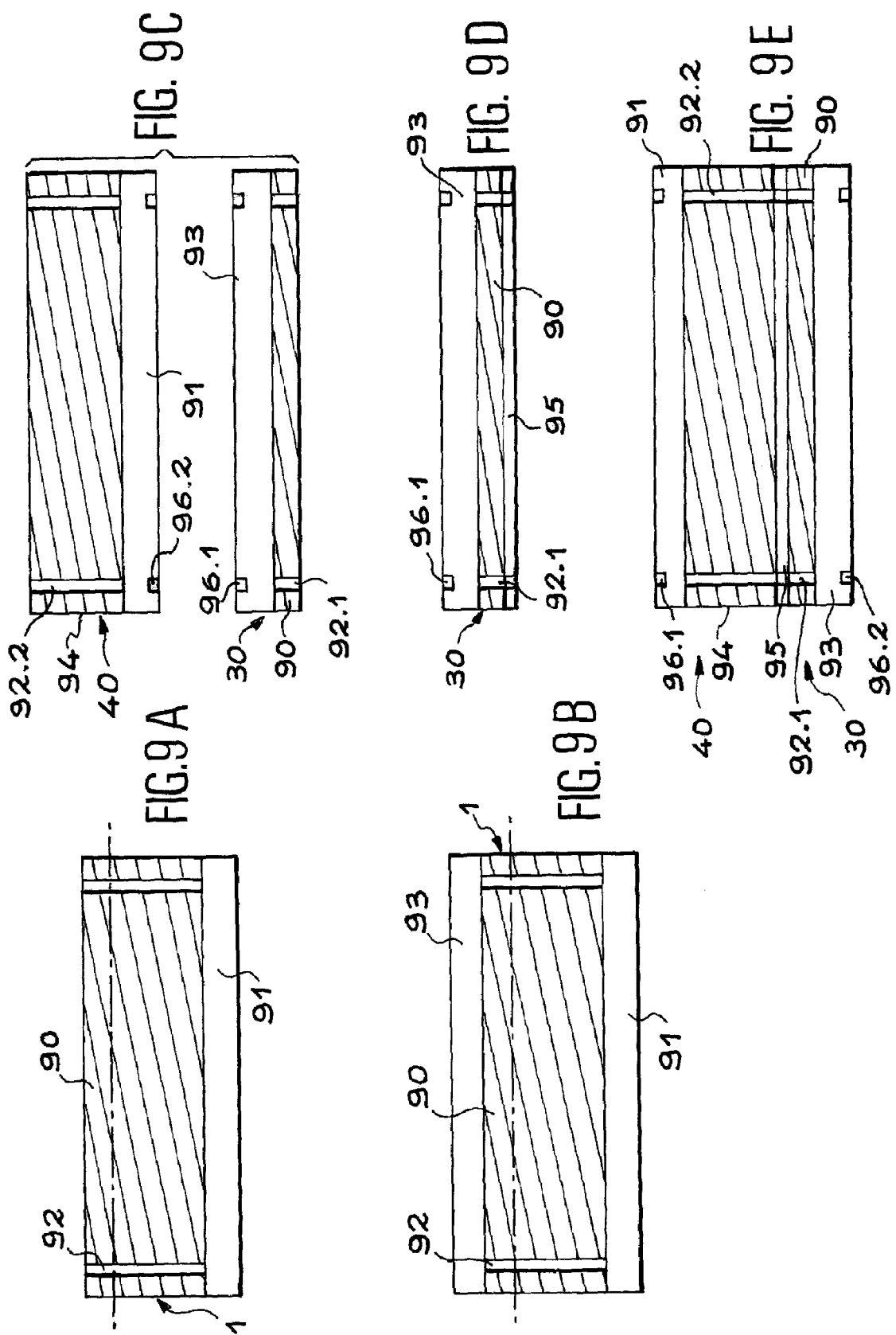

METHOD FOR PRODUCING A STACKED STRUCTURE

CROSS-REFERENCE TO RELATED APPLICATION

This application claims the benefit of PCT/FR01/04130, filed Dec. 27, 2001, which claims the benefit of France Application No. 00/17215, filed Dec. 28, 2000, the contents of which are hereby incorporated herein by reference in their entirety.

TECHNICAL FIELD

The present invention concerns a method for producing a stacked structure from structures to assembly, each comprising at least one crystalline part. The invention applies particularly to the microelectronics, optics and optoelectronics fields.

Generally, structures in which the crystalline part is in semi-conductor material and in particular in silicon, in $Si_{1-x}Ge_x$, in silicon carbide, in germanium, in gallium nitride, in indium phosphide, in gallium arsenide or any other III-V, II-VI, IV-IV compounds are of interest. Superconductor materials and dielectric materials such as diamond may also be of interest. Said materials are used alone or in combination.

STATE OF THE PRIOR ART

The assembly of wafers made out of semiconductor materials is a classical step and well-known in electronics. One may refer for example to the American patent U.S. Pat. No. 5,661,316 of Kish Jr. et al which proposes forming an ohmic junction between two wafers 101, 102, in reference to FIGS. 1A and 1B.

The faces of the wafers to be assembled generally have a tilt angle respectively $\alpha_1$, $\alpha_2$ in relation to a crystallographic surface plane. In said American patent, one aims to reduce as much as possible, in the plane of the interface, the twist angle $\theta$ between the two crystalline networks presented by the faces to be assembled and the resulting tilt angle $\alpha$ which is the angle between the crystallographic planes of the faces of the wafers once they are brought into contact.

The twist angle $\theta$ is shown in FIG. 1A. The resulting tilt angle $\alpha$ is shown in FIG. 1B. The traces of the crystallographic planes are schematically represented by the series of parallel lines in FIG. 1B. The rotational offset angle $\theta$ is known as the "twist" angle, whereas the angles of inclination $\alpha_1$, $\alpha_2$ are known as "tilt" angles. The tilt angle $\alpha$ between the crystallographic planes of the two faces of wafers 1 and 2 once they are brought into contact depend on the tilt angles $\alpha_1$ and $\alpha_2$ and the twist angle $\theta$.

In the following description, the term twist angle will signify the rotational offset angle, the term tilt angle will signify the tilt angle of one face in relation to the crystallographic planes of said same face and the term resulting tilt angle the angle between the crystallographic planes of the interface of the two wafers or structures assembled against each other.

In patent application WO 99/05711 in the name of the Commissariat à l'Energie Atomique (Atomic Energy Commissariat), to produce self-organised microstructures or nanostructures, one aims to have, at the interface between two wafers, at least one very well controlled crystallographic misalignment in such a way as to form a network of crystalline defects and/or a network of stresses within a crystalline zone extending from each side of the interface. To achieve this, one aims to have, at the interface, a twist angle $\theta$ and/or a properly predetermined resulting tile angle $\alpha$.

In both cases, when one wishes to form said assemblies, one needs to control with a high degree of precision, at the interface between the two structures to be assembled, the twist angle and/or the resulting tilt angle as defined above.

At present, in order to control, at the interface between two structures, the resulting tilt angle, one chooses structures in which one knows the tilt angle. Said angle may be measured for example by X-rays.

One may also, through non-homogeneous polishing methods or local removal of material, impose a tilt angle on each structure. If one knows the tilt angle of several structures, one can make a selection in such a way as to pair structures that will give a resulting tilt angle with a suitable value. The selection method necessitates having at one's disposal a multitude of structures to be assembled, especially if a high degree of precision in the resulting tilt angle is sought.

However in all cases, the value of the tilt angle and its direction in relation to the crystalline axes which define the angle of rotation must be known for each of the structures before assembly. Said methods are very ponderous to use and are time consuming.

Moreover, if the tilt angles of the faces to be assembled of the two structures are not exactly identical, which is difficult to obtain, it is not possible for the assembly to lead to a resulting tilt angle of virtually zero since it is at the least the difference between the tilt angles of the two faces to be assembled.

In order to control the twist angle, one may equip the structures to be assembled with reference flats and use said reference flats during the assembly, as shown in the above-mentioned patent U.S. Pat. No. 5,661,316. But the difficulty resides in the fact of knowing the crystallographic orientation of the reference flat on each of the structures. Therefore, it is necessary to determine at least one axis of the crystalline network of each of the structures. One way of determining the crystalline axis may be by using X-rays but the thinner the structure, the less precise is the determination. With a crystalline film whose thickness is around 200 nanometres, the precision of determining a crystalline axis by X-rays can only easily attain one hundredth of a degree.

The article "Article alignment for wafer bonding" by Yuang-Fang CHOU and Ming-Hsun HSIEH, published in Proceedings SPIE, The International Society for Optical Engineering, Micromachining and Microfabrication Process Technology II, Vol. 2879, 1996, pages 291 to 299, proposes a method for determining the twist angle between the crystalline networks of two wafers to be assembled. It involves an anisotropic chemical etching method carried out on each of the wafers before their assembly. It allows their crystalline directions to be revealed but the difficulty lies in controlling the twist angle of their crystalline networks during the assembly in such a way as to obtain a high degree of precision. Moreover, the article does not teach the control of the tilt angle of the wafers.

DESCRIPTION OF THE INVENTION

The aim of the present invention is to propose a method for producing a stacked structure which does not have the disadvantages of the prior art. The stacked structure obtained by the method of the invention has a twist angle between the crystalline networks of the two crystalline parts of the structures to be assembled and an easily controllable resulting tilt angle, combined with a high degree of precision, which can reach one hundredth of a degree.

In order to achieve this, the method according to the invention is a method for producing a stacked structure from structures to be assembled in order to form the stack, said structures to be assembled each comprising at least one crystalline part. It comprises at least the following steps:

obtaining at least two crystalline parts by detaching them from a same initial structure, each detached crystalline part having one face created by the detachment, each face created having a tilt angle with a reference crystalline plane of the initial structure, the difference between the tilt angles of the two faces created being determined, forming structures to be assembled from said crystalline parts, said structures each having a face to be assembled which has a controlled tilt angle in relation to the tilt angle of the created face of the corresponding crystalline part, assembling said structures by their face to be assembled while controlling the relative positions of said structures, rotating in the interface plane, in relation to the relative positions of the respective crystalline parts within the initial structure, in such a way as to obtain a controlled resulting tilt angle at the interface between said structures.

It is advantageous if the difference between the tilt angles of the two created faces of the two crystalline parts is virtually zero, in other words that the tilt angles of the two created faces of the two crystalline parts are substantially equal, which makes it possible in particular to obtain a resulting tilt angle of substantially zero.

The structures to be assembled may obviously be entirely in a same crystalline material and in this case the step of forming the structures to be assembled is carried out at the same time as the step of obtaining the crystalline parts.

On the other hand, the structures to be assembled may comprise respectively a crystalline part on a support, and the crystalline part may even be covered with a non-crystalline layer.

In this latter case, several means of forming the structures to be assembled are conceivable. In particular, the crystalline part may be combined with a support before or after the detachment in the initial structure. Moreover, each detached crystalline part may comprise one or several stacked crystalline materials, which may be combined with one or several non-crystalline materials.

One may also provide for, before the assembly and after the detachment, at least one step of preparing the face to be assembled of at least one of the structures, said preparation step being carried out while controlling the change of the tilt angle of said face.

Said preparation step may be a thermal polishing or smoothing of the face to be assembled.

Said preparation step may be a thinning down of the structure in such a way as to expose a buried crystalline material of the crystalline part.

Said preparation step may be a step of depositing or building up a material on the face to be assembled.

The material may be crystalline or amorphous.

Said preparation step may be a combination of these steps.

One may provide for, before the detachment of at least one of the crystalline parts, a step of attaching the crystalline part onto a first grip. Said grip is important if the crystalline part is thin.

One may provide for a step of attaching the crystalline part on a second grip after its detachment from the initial structure, then a step of removing the first grip, freeing the face to be assembled. The crystalline parts are then turned round in relation to their positions before detachment.

Advantageously, an ion implantation step may be carried out in at least one of the structures and especially in at least one of the grips or the junction between the crystalline part and grip. Said step may contribute to the elimination of the grips.

The detachment may be carried out by mechanical, optical, chemical or thermal means used alone or in combination.

One may also carry out an ion implantation step through one face of the initial structure in order to obtain an embrittled zone, then by treatment capable of leading to the separation of a crystalline part at the level of the embrittled zone. Said treatment may be a thermal annealing, an application of mechanical force or a combination of the two.

The assembly step may be carried out with input of material or without input of material, particularly by molecular adhesion.

The control of the relative positions of the structures during the assembly may comprise a step of marking at least one crystalline axis of at least one of the crystalline parts.

In a simpler manner, the control of the relative positions of the structures during the assembly may be carried out by means of at least one set mark borne on the initial structure and which is refound on the crystalline parts after detachment. Obviously, said marks may be found in the crystalline materials or not of these parts.

A reference flat or one or several series of graduation may act as set marks.

One may, before or after the detachment, transfer said marks onto other parts of the structures to be assembled and/or the initial structure such as their rear faces, or the grips if appropriate.

Advantageously, said set marks may be etched in the initial structure which has been subjected beforehand to a step of ion implantation in order to create an embrittled zone, said etching extending beyond the embrittled zone. After the attachment of a grip on the implanted face and a treatment capable of leading to the separation at the level of the embrittled zone, the set marks are found again on the two structures to be assembled.

In order to obtain a positioning with precision, the control of the relative positions of the structures during assembly may be carried out by adjusting the position of at least one set mark of one of the structures to be assembled in relation to the position of at least one set mark of another structure to be assembled, by means chosen from among optical, mechanical, acoustical or hydrodynamic means, said means being used alone or in combination.

The present invention also concerns a stacked structure, obtained by the method thus described, from structures to be assembled composed in part or in totality of at least one of the materials chosen from among semi-conductors, superconductors, dielectric materials, metallic materials, magnetic materials, said materials being used alone, in combination and/or in mixtures.

The method described above may be repeated for the stacking of several structures to be assembled in which the crystalline parts may be taken from a same initial structure.

BRIEF DESCRIPTION OF THE DRAWINGS

The invention will be more fully understood and other characteristics and advantages will become clearer on reading the description that follows, given by way of illustration and in nowise limitative, and by referring to the appended drawing amongst which:

FIGS. 3A, 3B, 3C and 3D illustrate different steps of a first embodiment of the method according to the invention;

FIGS. 9A to 9E illustrate different steps for another embodiment of the method according to the invention.

DETAILED DESCRIPTION OF SPECIFIC EMBODIMENTS

Figure 1:
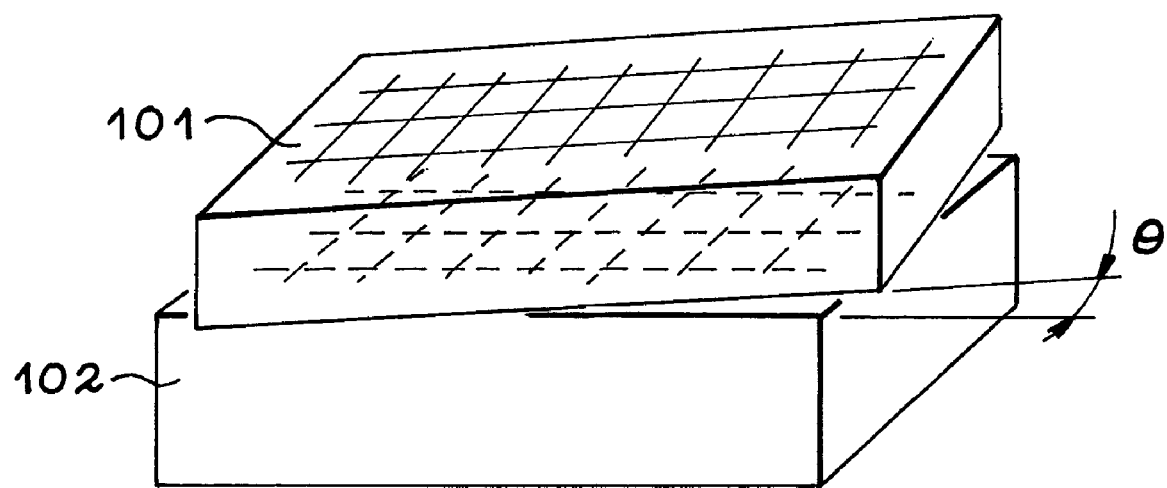
FIG. 1A (already described) illustrates the twist angle θ existing between the crystalline networks of two wafers assembled one against another.
FIG. 1B (already described) illustrates the tilt angles $\alpha_1$, $\alpha_2$ formed between the crystallographic planes of the faces to be assembled of the two wafers and the assembly interface and the resulting tilt angle α formed by the crystallographic planes of the faces, once they are brought into contact.
Figure 1:
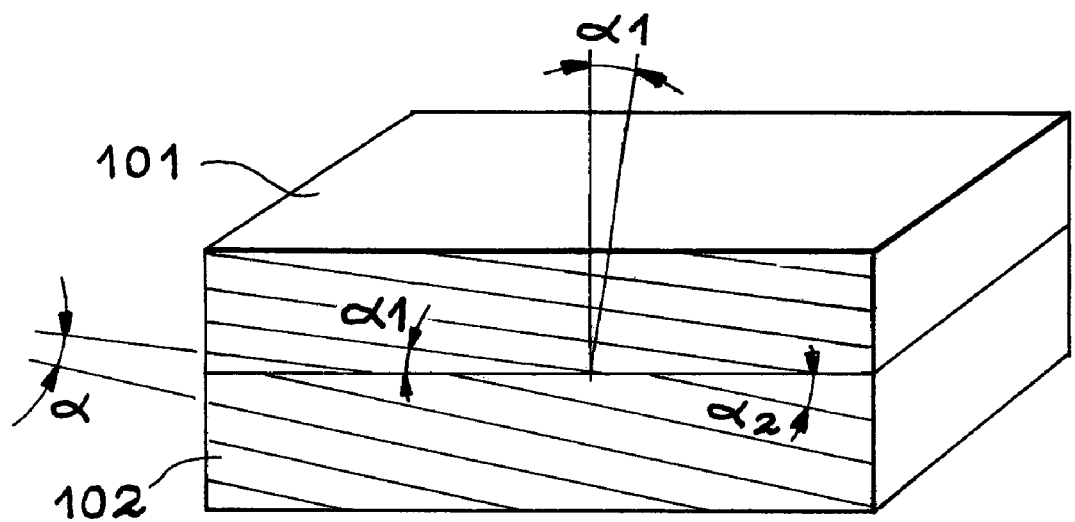
Figure 2A:
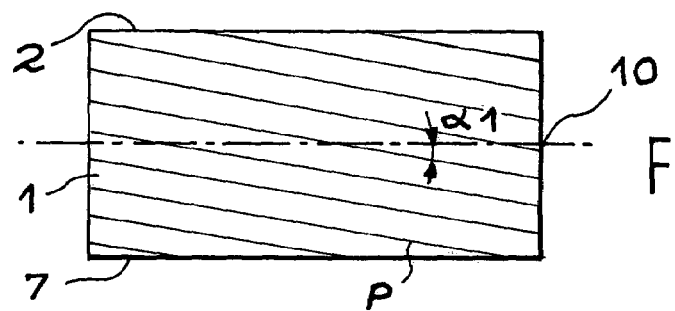
FIGS. 2A, 2B and 2C illustrate different steps of the method according to the invention.

The reader should refer to FIG. 2. FIG. 2A shows an initial crystalline structure 1. The traces of a crystallographic plane p, called reference plane, of said initial structure 1 are schematically represented by the sloping parallel lines. The dotted line indicates a cutting plane that will be made to obtain two crystalline parts 3, 4 that will be used to form two structures to be assembled by stacking them one on top of the other in such a way as to obtain the stacked structure according to the invention. A tilt angle $\alpha_1$ exists between the reference crystallographic plane p of the initial structure 1 and the cutting plane. The crystalline parts 3, 4 have a face created by the cut referenced respectively 8, 9 and said created faces 8, 9 have a tilt angle $\alpha_1$, $\alpha_2$ in relation to the reference crystallographic plane p. In the example described, since a single cutting plane has been made, the tilt angles $\alpha_1$, $\alpha_2$ are substantially equal and equal to $\alpha_1$.

Figure 2B:
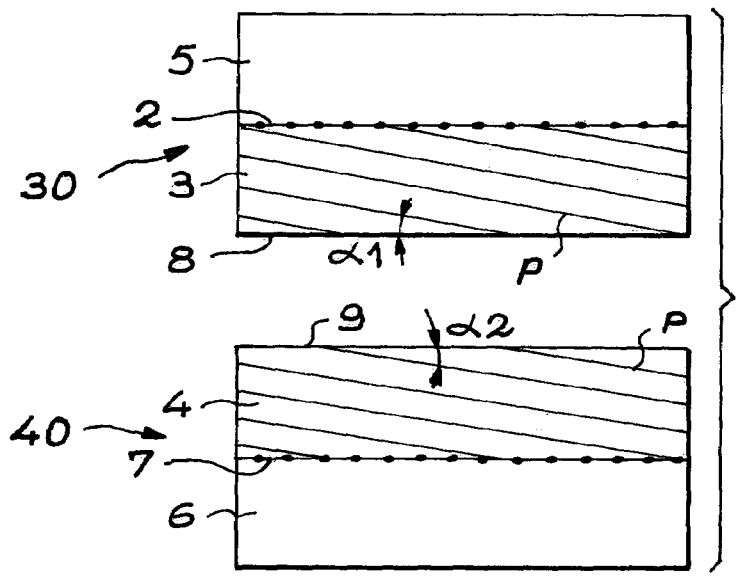

In the example described of FIG. 2B, it is assumed that the detached crystalline parts 3, 4, each attached to a mono- or multi-layer support 5, 6, form structures to be assembled 30, 40. One could cut more than two crystalline parts 3, 4 in the initial structure 1 and stack up more than two structures to be assembled each against the other. One could thus obtain a thick stacked structure from a plurality of thin crystalline parts. Said stacking of structures to be assembled may be deposited on any support.

One could thus bond two by two the crystalline parts 3, 4 and thus obtain a plurality of assembled structures 30, 40 from a single initial structure 1.

Said initial structure 1 may be formed in totality from one or several crystalline materials or be composite, based on crystalline and non-crystalline materials.

The separation may be made at the interface between two different materials or within a same material.

The crystalline materials may be semi-conductors, superconductors, dielectrics, metallics or magnetics.

As semi-conductor materials, one may use silicon, $Si_{1-x}Ge_x$, silicon carbide, germanium, gallium nitride, indium phosphide, gallium arsenide or more generally all III-IV, II-VI and IV-IV compounds. One may also use as dielectric material diamond, as metallic materials copper, iron, platinum, palladium, as magnetic materials copper, iron, CrCo, FeNi, FeAlSi and FeNiAg alloys, garnet ((rare earth)$_3$Fe$_{5-x}$Metal$_x$O$_{12}$), as superconductor materials YbaCuO, NbN. All of these materials may be used alone, in combination and/or in mixtures. As non-crystalline materials, one may use polymers, $SiO_2$, $Si_3N_4$.

In the initial structure 1, we will begin by detaching at least two crystalline parts 3, 4 from which the structures to be assembled 30, 40 will be obtained.

The two created surfaces 8, 9 of the two detached crystalline parts 3, 4 each have a tilt angle $\alpha_1$, $\alpha_2$ respectively in relation to the reference crystallographic plane and said tilt angles may be equal or different. They may be known or not. On the other hand, what is determined, is the difference between said tilt angles.

The cutting may be carried out by mechanical means, with a saw or a water jet for example, by ultrasonic means, optical means with a laser for example, chemical means or thermal means or according to the method described in the patent application FR-A-2 681 472. Said means may be used alone or in combination.

The ultrasonic means may comprise a tool which is induced to vibrate by an ultrasonic transducer. The vibrating tool is placed in contact with the initial structure 1 in which one wishes to detach the crystalline parts 3, 4 and it penetrates into the material along a specific direction. One may intercalate abrasive particles between the vibrating tool and the initial structure which facilitates abrasion, said abrasion only being produced between the tool and the material of the initial structure 1. The shape of the tool defines the machining shape carried out. By giving the tool a form such that its section is trapezoidal, with two faces forming an angle with a determined value, of several tenths of degrees for example, the difference in the tilt angle of the two faces obtained by the cutting will be substantially equal to said determined value. The tilt angles of the created faces will be different.

According to patent application FR-A-2 681 472, which allows the separation by fracture of thin films, one implants ions, protons for example, through a face 2 of the initial structure 1, in order to obtain an embrittled zone 10, schematically represented by the dotted lines, at a determined depth in relation to the implanted face 2. Said implanted face 2 is then for example attached to a grip 5 whose purpose is to facilitate the handling of the crystalline part 3 which is detached subsequently. Said grip 5 may also play a role of stiffener for the crystalline part during the separation. The grip may be formed in one at least of the materials in the list cited above.

The means of attaching the grip 5 may be through bonding with an adhesive substance, a substance arising from a deposition by a physical or chemical process such as evaporation, sputtering, chemical deposition in vapour phase, for example by a bonding by molecular adhesion. The means of attachment may be used alone or in combination. In particular, a thermal treatment may be used to adapt the attachment efficiency. This step is not shown. A step of chemical cleaning of the two faces to be bonded is generally provided before an attachment by molecular adhesion.

A mechanical treatment and/or a treatment by thermal annealing may then be applied. Their purpose is to separate into two parts 3, 4, at the level of the embrittled zone 10, the initial structure 1. The faces created by the separation bear the reference 8 for the crystalline part 3 and the reference 9 for the crystalline part 4. With a cutting method of this type, the tilt angles in relation to the reference crystallographic plane that the two created faces 8, 9 of the crystalline parts 3, 4 have are substantially equal. They are substantially equal to the tilt angle in relation to the same reference crystallographic plan that the implanted face 2 has. As a result, one may then assembly equally well the faces 8, 9 or 2.

It may be conceived that the initial structure 1 has another face 7 held by a grip 6 before the separation. Said second grip 6 could be attached by one of the methods recommended above. This characteristic is not represented in FIG. 2A but the two grips may be seen in FIG. 2B.

If the grips 5, 6 have to be removed after obtaining the stacked structure, one chooses their material and their method of attachment in consequence. For example, a grip in silicon oxide may be removed in a hydrofluoric acid bath. One could remove them by one of the means of separation of the crystalline parts described above.

In the example described, the crystalline parts 3, 4 each attached to a grip 5, 6 form the structures 30, 40 to be assembled. The two structures 30, 40 obtained will be assembled together by their created faces 8, 9 while controlling the relative positions of the structures 30, 40, rotating in the plane of the interface, in relation to the relative positions of the crystalline parts 3, 4 within the initial structure 1 in such a way as to obtain a controlled resulting tilt angle at the interface between the two structures 30, 40. The reference is given by the relative positions of the crystalline parts before the separation.

Figure 2C:
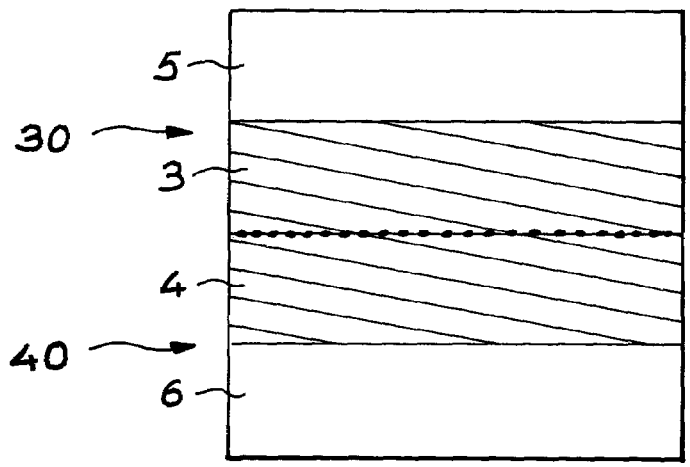

In FIG. 2C, which illustrates the assembly of the two structures 30, 40, one assumes that the two crystalline parts 3, 4 conserve the same relative positions in rotation before the separation and during the assembly.

This configuration without any twist makes it possible to render zero or virtually zero the resulting tilt angle between the crystallographic planes with the same index of the interface, of the two structures. In fact, the tilt angles of the two faces to be assembled are substantially equal if the separation is brought about along a single cutting plane in the initial structure.

If the assembly of the structures leads to an assembly of the detached crystalline parts as such without surface preparation, with a twist angle in the plane of the interface of zero or virtually zero, the resulting tilt angle will be zero or virtually zero.

It is then possible to minimise or to control the resulting tilt angle without having to know the tilt angle of each of the structures.

Moreover, one may introduce an intentionally very well controlled variation of tilt angle, for example by chemical mechanical polishing (CMP), on at least one of the structures to be assembled. One can thus control the resulting tilt angle without needing to know the tilt angles of the two structures to be assembled. One then controls the tilt angle that the face to be assembled of the treated structure has in relation to the tilt angle of the created face of the corresponding detached crystalline part.

The assembly of the two structures 30, 40 may be a sealing with or without input of material at the interface between the two structures 30, 40. If there is input of material to form the junction, it may have disappeared or not at the end of the assembly. A type of advantageous assembly is known by the term molecular bonding. Said molecular bonding may, for example, be hydrophobic, hydrophilic, anodic, eutectic or metallic type. For a hydrophobic molecular bonding, the two surfaces 8, 9 to be assembled receive a treatment in order to make them hydrophobic. Said treatment may comprise a step of chemical cleaning terminating, for example, in a step of hydrofluoric acid attack. One then brings the faces 8, 9 treated in this way into contact, at ambient temperature, while controlling the relative positions of the two structures 30, 40, rotating in the plane of the interface, in relation to the relative positions of the respective crystalline parts 3, 4. The reference is the position of the crystalline parts before detachment. Said bringing into contact is illustrated in FIG. 2C.

The two structures 30, 40 are then subjected to a thermal treatment in such a way as to favour inter-atomic bonds at the interface.

Moreover, the two structures 30, 40 to be assembled may be subjected to one or several surface treatments or surface attack before carrying out the assembly.

For example, after the separation, the separated surfaces have micro-roughness which may be lessened by mechanical, chemical or chemical mechanical polishing or a smoothing thermal treatment, at high temperature, in different atmospheres, for example, for the surface smoothing of silicon, under hydrogen, under argon, under nitrogen or under vacuum. Said treatment may not modify the tilt angle of the structure in relation to that of the detached crystalline part but if it is modified, said modification of tilt angle is quantified in such a way as to be able to obtain a controlled resulting tilt angle at the interface between the two structures during the assembly.

Each crystalline part 3, 4 may comprise several stacked crystalline materials, and may if necessary be combined with one or several non-crystalline materials, as will be seen when FIG. 4 are described. In this case, at least one of the structures to be assembled is composed of several materials, it is possible to carry out a thinning operation, for example by chemical and/or ionic attack in order to expose at the surface a crystalline material which would still be buried after separation. It is this configuration that FIG. 4, which will be described below, illustrate. An etching stop layer 17 is included in one, the other or both structures to be assembled and the thinning operation is an attack carried out up to said stop layer 17.

One may advantageously carry out at least a deposition or the build up of at least one material on at least one of the separated surfaces.

It is assumed that this embodiment is illustrated in FIG. 3B, which is described below. The separated face 8 of the crystalline part 3 leading to the structure 30 is covered with a crystalline material. The layer obtained bears the reference 11. Advantageously, the deposition may be carried out by epitaxy.

The material of the layer 11, instead of being crystalline may be amorphous. It may for example be silicon oxide, silicon nitride, glass, a polymer, for example an epoxy adhesive. Said material may disappear during the thermal, chemical or mechanical treatments carried out before, during or after the assembly. As a result, said material may be present or not at the assembly interface.

The polishing, build up of deposit and thinning treatments may make it possible to impose on the surfaces to be assembled a well determined tilt angle variation and thus may make it possible to induce a resulting relative tilt angle for which the value is chosen at will.

The surface preparation steps may also only very slightly change the tilt angles of the faces to be assembled in relation to the tilt angles of the created faces of the crystalline parts. For example, if one removes a thickness of 400 nanometres from the surface of a wafer of around 10 centimetres diameter, the variation in the tilt angle may be less that one thousandth of a degree, which is considered as negligible.

Advantageously, an ion implantation step may be carried out before bringing into contact the structures 30, 40 to be assembled, at the level of at least one of the grips 5, 6 or at the interface between the crystalline part 3, 4 and the corresponding grip 5, 6 or in the crystalline part 3, 4. It is assumed that in FIG. 2B an ion implantation has been carried out in the structures to be assembled 30, 40 at the junction 2, 7 between the grips 5, 6 and the crystalline parts 3, 4, the embrittled zones are schematically represented.

Said ion implantation may be carried out by hydrogen, helium and/or any other gaseous species capable of being implanted. Said implantation induces in-depth an embrittled zone. This step may be profitably employed particularly to separate at a later stage the grip from the structure to which it is attached. The separation will take place at the level of the embrittled zone induced by the implantation by applying, for example, the thermal treatment recommended in patent application FR-A-2 681 472.

Said ion implantation step may be carried out before the separation of the crystalline parts, before the assembly of the structures or after.

Reference will now be made to FIG. 3. One begins with an initial structure 1 (FIG. 3A). One equips each of its faces with a grip, respectively 5, 6 and one separates into two parts the initial structure 1 by ion implantation through one of the faces 7 and fracture. One obtains two structures 30, 40 to be assembled. Each comprises a crystalline part 3, 4 attached to a grip 5, 6. The crystalline parts 3, 4 each comprise a separated face 8, 9 created by the fracture. Said faces 8, 9 have substantially the same tilt angle as the face 7 through which the ion implantation was carried out. One subjects one of the separated faces 8 to a build up of a crystalline material 11 (FIG. 3B). As regards the other structure 40 obtained after the separation, one attaches on its separated face 9 a second grip 12 (FIG. 3C). One then removes all or part of the first grip 6. Several possibilities of removal may then be envisaged.

One may pull them apart, by applying opposite forces to the grip 6 and the crystalline part 4. An elimination by chemical attack or by mechanical abrasion are conceivable. A combination of these methods may be used.

The abrasion may extend beyond the grip 6 and wear away a part of the crystalline part 4. The dotted lines in FIG. 3C show where the abrasion finishes. The stopping of the abrasion may advantageously be achieved by a stop layer. It is assumed that in FIG. 3D a layer of material of the structure 40 has been removed in the crystalline part 4 during the removal of the first grip 6. Said removal has exposed a crystalline face 13 of the crystalline part 4 of the structure 40 and it is said face 13 which is going to be assembled to the treated face of the other structure 30.

One could have conceived that this turning of structure by means of a pair of grips is carried out on the two structures 30, 40. At least one of the assembled faces may not be one of the faces obtained by the separation. In this case also one should be able to follow the evolution of the tilt angle of the assembled face of the structure in relation to that of the created face of the corresponding detached crystalline part.

FIG. 4 illustrate the case where several separations are carried out in the initial structure 1. In FIG. 4A, the initial structure 1 is composite and formed of several crystalline layers 15, 16, of an amorphous layer 21 stacked one on top of the other, the amorphous layer 21 being located between the two crystalline layers 15, 16. In this example, the tilt angles of the two faces of the layer 15 must be equal. This is the case, for example, if the initial structure 1 is an SOI (silicon on insulator) type. A stop layer 17 may be placed between one of the crystalline layers 15 and the amorphous layer 21.

Figure 4A:
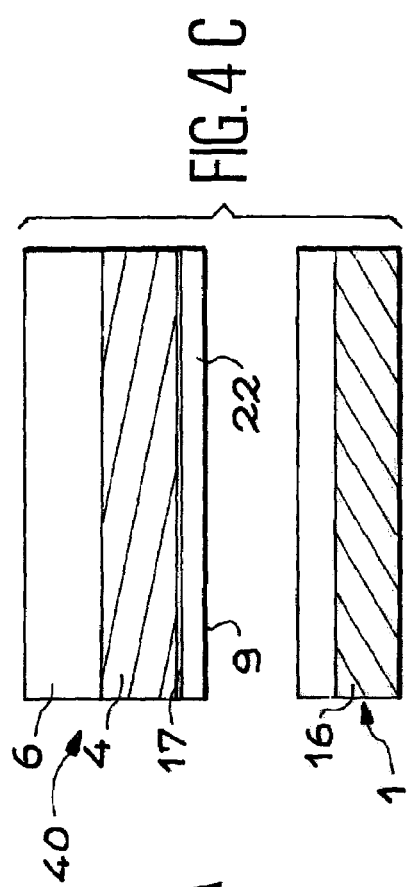
FIGS. 4A, 4B, 4C and 4D illustrate different steps of a second embodiment of the method according to the invention.
Figure 4B:
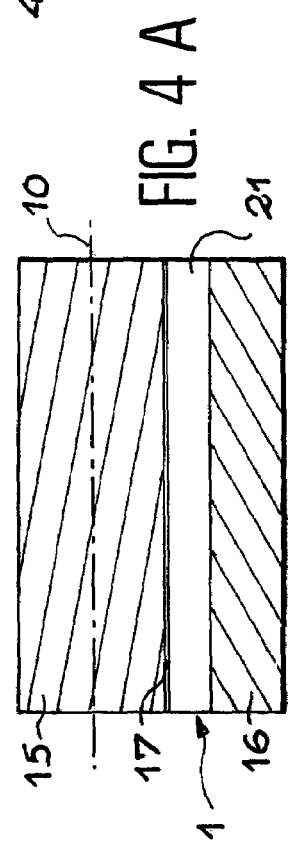

One separates the initial structure 1, by ion implantation through the layer 15 and one fractures, along the plane 10, a first crystalline part 3, represented attached to a grip 5 in FIG. 4B and the assembly forms one of the structures 30 to be assembled. The created face of the crystalline part 3 is free, and bears the reference 8, which is the face that is going to be assembled to form the stacked structure. Said crystalline part 3 is detached from the crystalline layer 15.

Figure 4C:
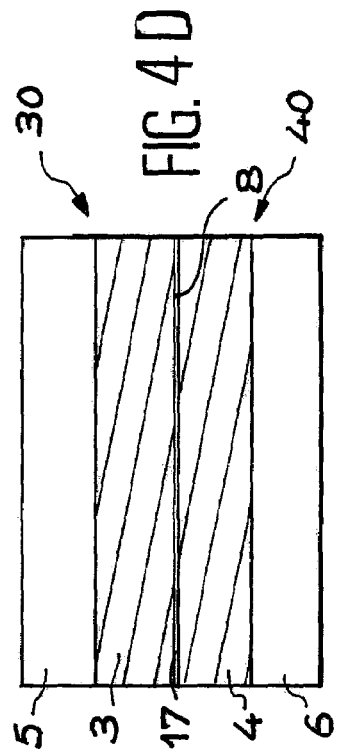
Figure 4D:
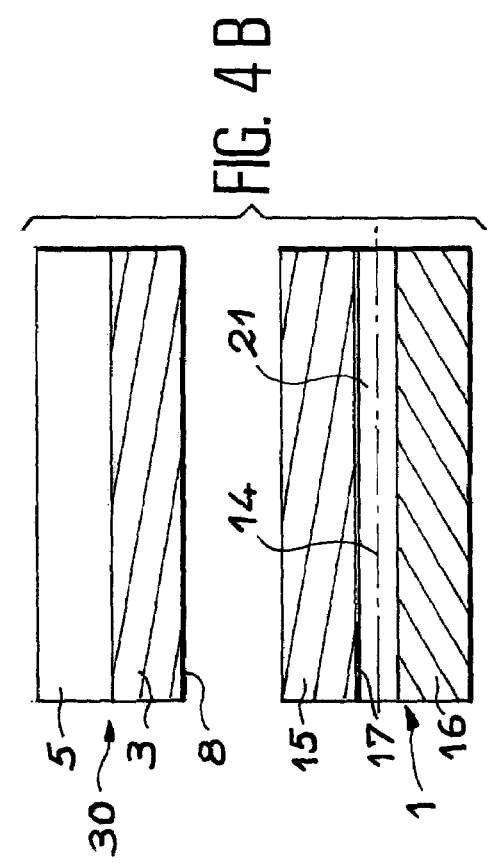

One then separates, along the plane 14 in the mass of the initial structure 1, a second crystalline part 4 that one also equips beforehand with a grip 6 (FIG. 4C). Said second crystalline part 4 comprises the crystalline material of the crystalline layer 15, and is associated with the stop layer 17 and the amorphous material 22 of the layer 21. The assembly comprising grip 6, crystalline part 4, stop layer 17, amorphous material 22 forms the second structure 40. Said second structure 40 comprises a free face 9 which corresponds to the amorphous material 22. One attacks said free face 9 up to all or part of the stop layer 17 in such a way as to eliminate the amorphous material 22. If the stop layer is absent, the elimination of the amorphous material 22 leads to the exposure of the crystalline material of the crystalline layer 15.

The free face 9 thus treated is assembled on the free face 8 of the other structure 30. This procedure makes it possible to economise the initial structure 1, which may be re-used.

During the assembly, if one provokes a rotation θ in the plane of the interface, of one of the structures to be assembled in relation to the other, one turns at the same time the direction of the tilt angle of the face to be assembled of the structure in rotation, in relation to the normal to said face. This makes it possible to modulate the value of the resulting tilt angle α between the two structures. A zero rotation angle θ will produce a resulting tilt angle α substantially equal to the difference, in absolute value, between the tilt angles $α_1$, $α_2$ of the faces to be assembled, whereas a rotation of 180° will produce a resulting tilt angle α substantially equal to the sum of the tilt angles of the faces to be assembled.

If the two structures to be assembled have the same tilt angle at the level of their face to be assembled, which is the case for example if the separation has been carried out, with the method described in the patent FR-A-2 681 472, according to the twist angle, the resulting tilt angle varies between 0°, for zero rotation, and twice the tilt angle, for a rotation of 180°. Through this type of separation method, the tilt angle is substantially that of the implanted face of the initial structure.

In this configuration in an advantageous manner, if one aims to obtain a zero resulting tilt angle, it is not even necessary to know the value of the tilt angle of the implanted face. On the other hand, if one seeks a predetermined value of the resulting tilt angle, only knowing the value of the tilt angle of the implanted face is necessary, but the determination of its direction is of little importance. This was not the case previously.

One may thus obtain a resulting tilt angle adjusted at will by playing on, during the assembly, the twist angle of the structures to be assembled.

Figure 5:
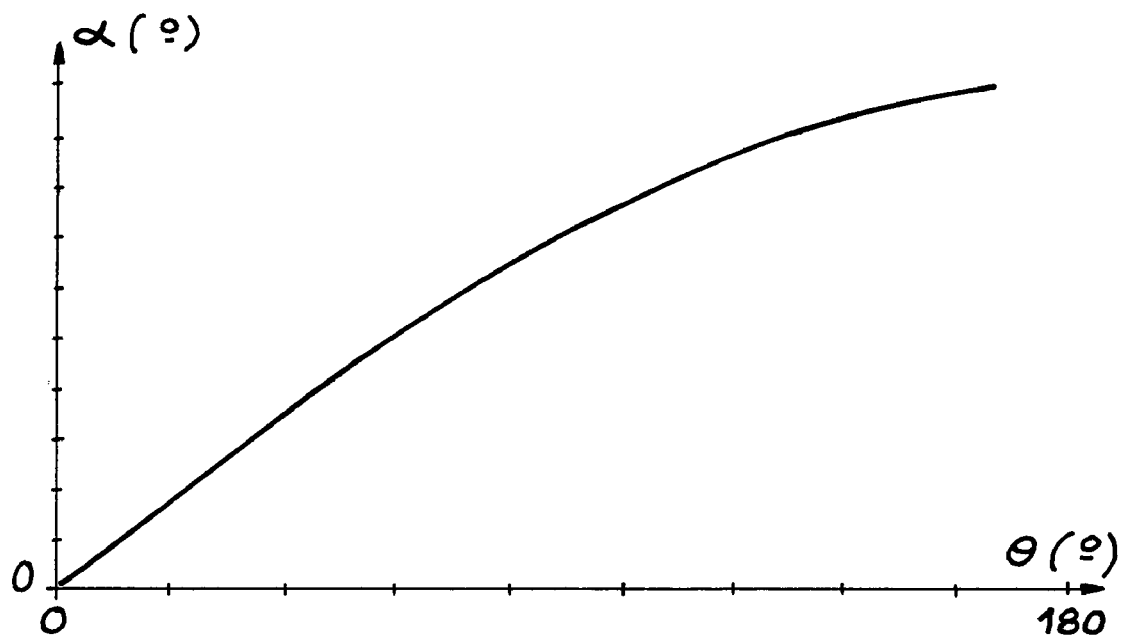
FIG. 5 shows the typical variations in the resulting tilt angle α as a function of the twist angle θ during the assembly of the two structures.

FIG. 5 shows the typical variations in the resulting tilt angle α as a function of the twist angle θ of the crystalline networks presented by the assembled faces.

However, in order to be able to finely control the twist angle θ of the crystalline networks presented by the two faces to be assembled, it is not necessary, as before, to know the crystalline directions of the crystalline networks presented by said faces, it is enough to control in a precise manner the relative positions in rotation of the structures to be assembled.

One may, from this point of view, before the separation step, make one or several set marks 18, 19 in the initial structure 1. Said set marks are such that they are refound in the structures 30, 40 to be assembled obtained from the crystalline parts detached from the initial structure.

Reference will now be made to FIGS. 6A and 6B. FIG. 6A illustrates, in cross-section, the initial structure 1 in the form of a disc bearing, advantageously near to its edge, two set marks 18, 19 advantageously diametrically opposite each other. Said marks 18, 19 may have, on the surface, the form of squares with 5 micrometres sides. They may be distant by around 8 centimetres if the diameter of the structure is around ten. Said marks 18, 19 extend sufficiently in depth in the initial structure 1 so that they are refound on the two structures 30, 40 to be assembled obtained from the initial structure 1. FIG. 6B shows the two structures 30, 40 to be assembled once separated as well as the set marks that they bear 18.1, 18.2, 19.1, 19.2. Said set marks are fractions of the set marks borne on the initial structure 1. In FIG. 6B, no grip has been represented, but there could be one, especially if the structures to be assembled are thin films.

Said set marks 18, 19 may or may not cross right through the initial structure 1, what is important is that said set marks are present on the two structures 30, 40 to be assembled, and in particular they completely cross through at least one crystalline part detached from the initial structure.

Said set marks 18, 19 may be formed by an engraving method chosen from among chemical etching, ion etching, optical engraving, for example by means of a laser beam, mechanic engraving through or not a mask made out of polymer for example, or by a combination of these methods.

Equipped with said set marks 18.1, 18.2, 19.1, 19.2, the structures 30, 40 may be assembled by aligning the marks two by two or, on the contrary, by providing for a controlled twist between them. Their alignment makes it possible to carry out an assembly with a substantially zero twist angle.

The positioning may be carried out advantageously in an optical manner, for example by infrared, a mechanical, acoustical or hydrodynamic manner or by a combination of these methods.

If the set marks are formed in a same initial crystalline structure in which will be made a detachment or in structures in crystalline relation, which is the case with the deposition of a layer for example by epitaxy, they have a same misalignment in relation to the crystalline directions presented by the faces to be assembled. One is sure that if one aligns the set marks, the twist angle θ of the crystalline networks presented by the faces to be assembled will be zero, apart from slight errors of alignment, and it will advantageously be thus whatever the initial orientation of the set marks. Finding out the directions of the crystalline networks is unnecessary.

For example, if the two structures to be assembled bear set marks 10 micrometres wide, separated by around 10 centimetres, and if they are aligned two by two, for example by infrared, under a microscope, it is possible to obtain a positioning in rotation of the two structures having a degree of precision of around one thousandth of a degree.

Advantageously, said set marks use up very little useful area in relation to that consumed by an anisotropic chemical etching used to reveal a crystalline direction.

Figure 7:
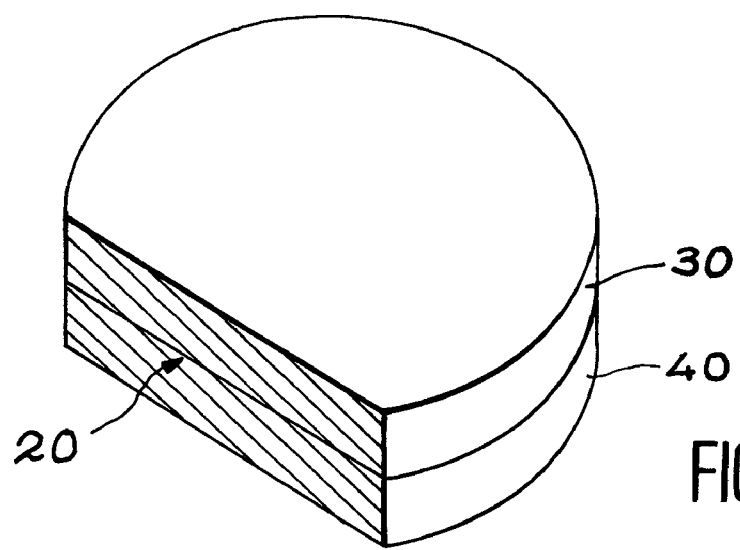
FIG. 7 illustrates two structures equipped with a reference flat assembled one against the other.
Figure 6:
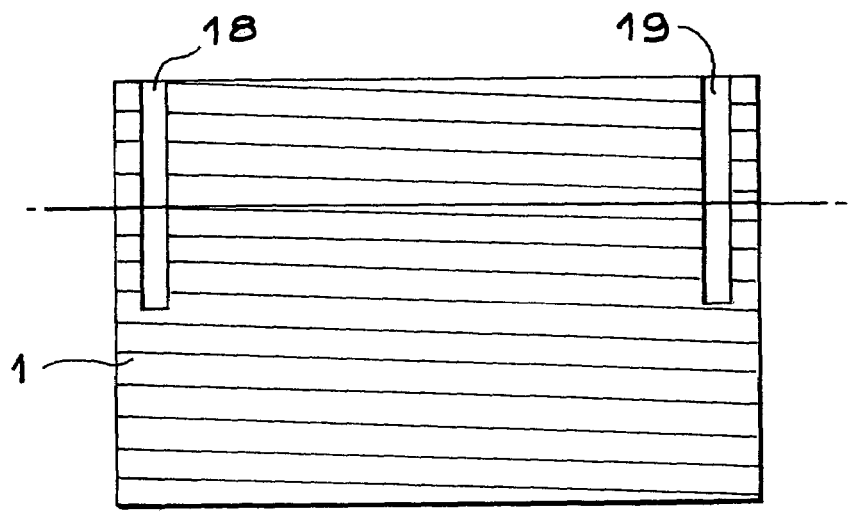
FIGS. 6A and 6B illustrate set marks made on the initial structure before the separation as well as the marks obtained on the structures to be assembled obtained by detachment from the initial structure.
Figure 6:
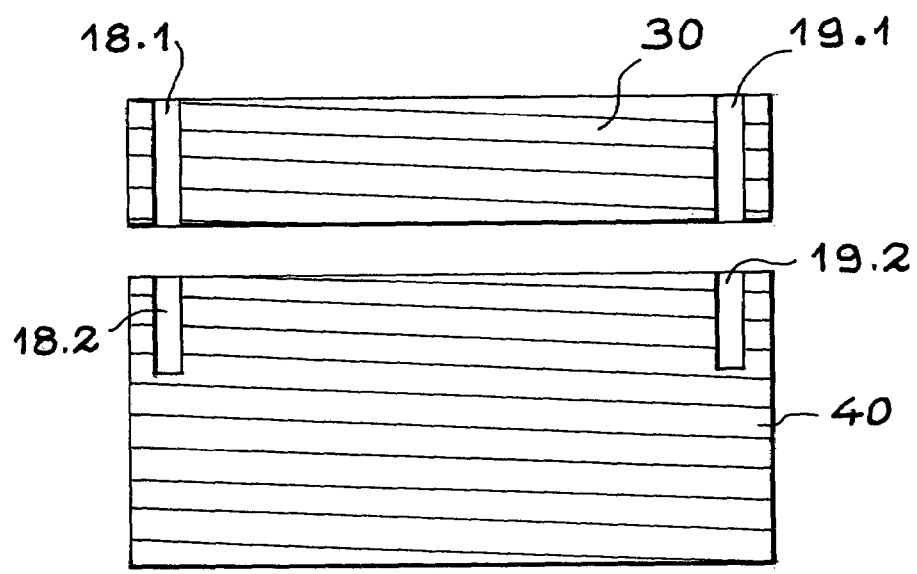

Instead of forming the set marks as described in FIG. 6, it is possible to equip the initial structure, generally in the form of a disc, with a reference flat 20. This embodiment is illustrated in FIG. 7 which shows the stacked structure according to the invention. It is formed of two structures to be assembled 30, 40 arising from the initial structure.

This type of reference flat, crossing through all or part of the initial structure, unique in its location relative to the structures to be assembled, advantageously solves the problem encountered when using reference flats available commercially and which are rounded by wafer edge chamfers.

One obtains at the end a structure in which the twist angle and the resulting tilt angle are known and chosen, without at any moment in the elaboration of this structure one needing to know the crystallographic direction of one or another of the crystalline parts.

Nevertheless, in order to control the twist angle between the structures to be assembled, one could also use a method for revealing at least one crystalline axis of the crystallographic networks presented by the faces to be assembled. One may cite, for example, chemical etching, X-rays, optical or acoustical disclosure or any other appropriate method using a property anisotropy.

We will now describe two embodiments of a stacked structure obtained by the method of the invention, in referring to FIG. 9.

One may, for example, detach a film 90 of $Si_{1-x}Ge_x$ where x<1 from an initial structure 1, supported if necessary by a substrate 91. To do this, one may implant hydrogen, in a quantity that is capable of allowing a separation in the initial structure 1. Said initial structure 1 is equipped with set marks 92 (FIG. 9A) One attaches the film 90 of $Si_{1-x}Ge_x$ onto a support 93, which serves as a grip (FIG. 9B). Through thermal treatment for example, one carries out the separation of the film 90 from the initial structure 1 (FIG. 9C). Said film 90 is going to contribute to forming one of the structures 30 to be assembled. The reference 94 illustrates the remaining part of the initial structure 1 after the separation of the film 90. Said remaining part is going to contribute to forming the other structure 40 to be assembled.

The set marks are refound on the two parts obtained with the references 92.1 on the film 90 and 92.2 on the remaining part 94 of the initial structure.

The set marks 92 may be carried over onto other parts of the structures 30, 40 to be assembled. In FIG. 9C, said set marks bear the references 96.1, 96.2 and they are carried over onto the rear faces of the structures 30, 40 to be assembled at the level of the grips 91, 93.

After the separation, one carries out a deposition 95 by epitaxy of $Si_{1-x}Ge_x$ on the separated film 90 while at the same time conserving the set marks 92.1 (FIG. 9D). If the set marks 96.1 have been carried over at the level of the grip 93, the conservation of the set marks 92.1 is not necessary.

One may then bond the epitaxied film 95 onto the remaining part 94 of the initial structure 1 while controlling the relative positions of the remainder 94 of the initial structure 1 and the detached film 90, rotating in the plane of the interface, in relation to the relative positions that they had before the detachment (FIG. 9E) by using the set marks 92.1, 92.2. One then controls the networks of dislocations generated at the interface.

Another example of the method according to the invention is partially illustrated in FIG. 8. One begins with an initial wafer 80 of crystalline silicon of around 10 centimetres diameter in which the normal to the surface has a tilt angle of more or less one degree in the direction <001>. One thermally oxidises said initial wafer 80 over a thickness of around 400 nanometres. Said initial wafer 80 is ionically implanted by hydrogen at an energy of 76 keV and a dose of $6.10^{16}$ at/cm$^2$.

One then forms the set marks. Here they take the form of one or several series of graduations 86. The graduations of a series may be grouped together into several series in the manner of those on a ruler or protractor.

Figure 8A:
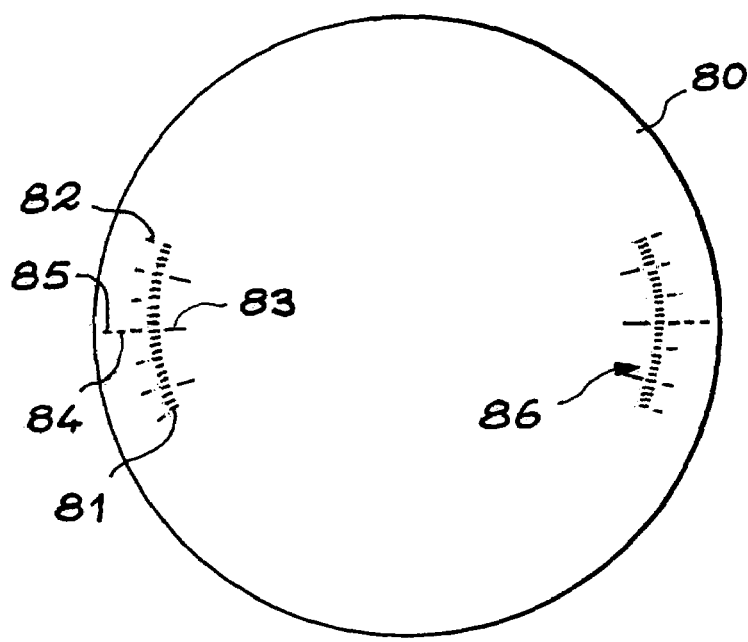
FIG. 8A shows several series of graduations similar to protractors, borne on an initial structure.
Figure 8B:
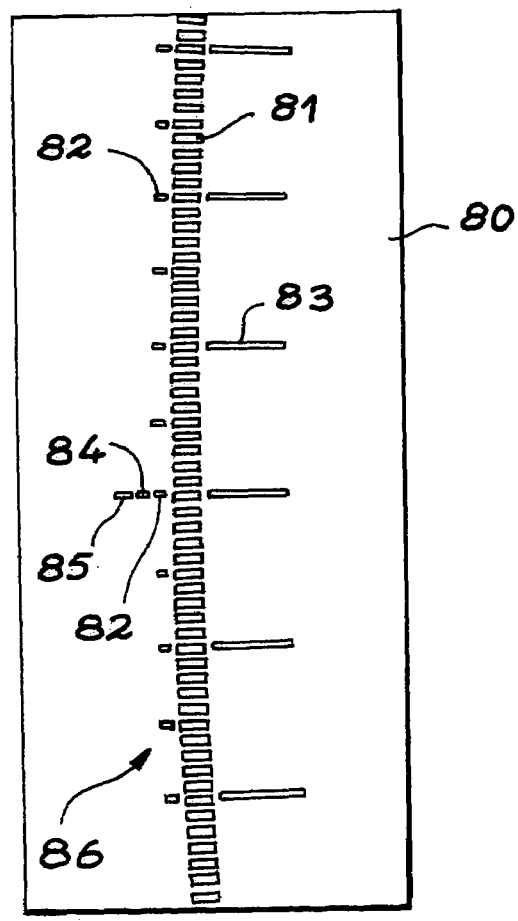
FIG. 8B shows an enlarged detail of a protractor from FIG. 8A.

One carries out a photolithography of the series of graduations 86 on the initial wafer. In the example in FIG. 8A, we have represented two series of graduations, each one extending over an arc of a circle of around 20° such as on a protractor. They are diametrically opposite to each other. The initial wafer equipped with series of graduations 86 is represented in FIG. 8A whereas FIG. 8B illustrates an enlarged portion of one of the series of graduations. The radius of each series is around 8 centimetres. Each series 86 comprises a first series of rectangular marks 81 of around 10 micrometres by 30 micrometres separated by one hundredth of a degree. A second series of marks 82 placed between the first series 81 and the edge of the initial wafer 80 makes it possible to mark out twentieths of degrees. A third series of marks 83 formed of larger rectangles, placed between the first series 81 and the centre of the initial wafer 80 makes it possible to mark out tenths of degrees. A fourth series of marks 84 placed between the edge of the initial wafer and the second series of marks 82 makes it possible to mark out degrees. For reasons of clarity, the series of marks in FIG. 8A are not to scale. A mark 85 makes it possible to mark off the middle of the series of graduations 86.

An RIE (reactive ionic etching), for example, makes it possible to etch the set marks 81, 82, 83, 84, 85 in the surface oxide and the silicon of the initial wafer down to a thickness of around 1150 nanometres. Said thickness is advantageously adapted to the thickness of oxide and the implantation conditions.

The initial wafer is then assembled by molecular adhesion onto another silicon wafer which acts as a grip and stiffener and a separation is made at the level of the zone where the ions were implanted, as described in the patent FR-A-2 681 472 already cited.

The separated face of the initial wafer is oxidised and the crown that appears during the cutting is removed either by reducing the diameter of the wafer or by ionic abrasion.

The wafer of silicon on which is bonded the film obtained by the separation undergoes a stabilisation of the bonding by means of a thermal annealing at a temperature greater than around 600° C. then a sacrificial oxidation of around 100 nanometres on the cut face. The cut faces of the initial wafer and the other wafer are then de-oxidised and polished, par example by chemical mechanical means or by smoothing thermal annealing, for example with hydrogen, to a thickness of around 100 nanometres in order to re-obtain a quality of surface comparable to that possessed by commercially available silicon wafers, i.e. a roughness less than 0.2 nanometres rms.

These operations modify the tilt angle of each of the faces of the wafers to a maximum of around $2.10^{-4}$ degree.

The polished faces of the two wafers are then assembled one against the other by hydrophobic molecular adhesion while controlling during the assembly their twist angle θ, by infrared, under a microscope, thanks to the series of graduations.

In the case of a twist angle θ less than one degree, the resulting tilt angle α does not exceed 2% of the tilt angle of the initial wafer. If the tilt angle of the initial wafer equals 0.5 degrees, the resulting tilt angle α is less than 9 thousandths of a degree, whereas if the tilt angle of the initial wafer equals 0.3 degrees, the resulting tilt angle α is less than 3 thousandths of a degree.

On the other hand, if the twist angle θ increases up to 180 degrees, the resulting tilt angle α increases until it reaches a value roughly equal to two times the tilt angle of the initial wafer.

Advantageously, a twist angle of 180° will allow, in the case of crystalline material with symmetry of an order greater than or equal to two, to use a behaviour of type "0°" of rotation.

The invention claimed is:

1. Method for producing a stacked structure from structures to be assembled, the structures each including at least one crystalline part, comprising:
    obtaining at least two crystalline parts by detaching the at least two crystalline parts from a same initial structure, each detached crystalline part having one face created by the detaching, each created face having a tilt angle with a reference crystalline plane of the initial structure and a difference between the tilt angles of the two created faces being determined by the detaching;
    forming structures to be assembled from the crystalline parts, the structures each having a face to be assembled that has a controlled tilt angle in relation to the tilt angle of the created face of the corresponding crystalline part; and
    assembling the structures by their faces to be assembled while controlling relative positions of the structures, rotating in an interface plane, in relation to relative positions of the respective crystalline parts within the initial structure, in such a way to obtain an intentionally adjusted resulting tilt angle at the interface plane between the structures.

2. Method according to claim 1, wherein the difference between the tilt angles of the two created faces of the two crystalline parts is substantially zero.

3. Method according to claim 1, wherein the structure to be assembled is formed by combining the crystalline parts with a support, the combining being carried out before or after the detaching.

4. Method according to claim 1, wherein the structure to be assembled is formed from a crystalline part covered with a non-crystalline layer.

5. Method according to claim 1, wherein the detached crystalline part comprises one or plural stacked crystalline materials configured to be combined with one or plural non-crystalline materials.

6. Method according to claim 1, wherein, when the structure to be assembled is formed entirely of a crystalline material, formation of the structure is carried out at a same time as an associated crystalline part is obtained.

7. Method according to claim 1, further comprising, before the assembling and after the detaching, at least one operation of preparing the face to be assembled of at least one of the structures, the at least one preparing operation being carried out while controlling a change in the tilt angle of the face.

8. Method according to claim 7, wherein the at least one preparing operation is a thermal polishing or smoothing of the face to be assembled.

9. Method according to claim 7, wherein the at least one preparing operation is a thinning down of the structure in such a way to expose a crystalline material of the crystalline part.

10. Method according to claim 7, wherein the at least one preparing operation is a thinning down of the structure down to a stop layer included in the structure to be assembled.

11. Method according to claim 7, wherein the at least one preparing operation deposits or builds up a material on the face to be assembled.

12. Method according to claim 1, further comprising, before the detaching of at least one of the crystalline parts, attaching the crystalline part to be assembled onto a first grip.

13. Method according to claim 12, further comprising attaching the crystalline part on a second grip after detaching of the crystalline part from the initial structure, and then removing the first grip, freeing the face to be assembled.

14. Method according to claim 1, further comprising ion implanting in at least one of the structures.

15. Method according to claim 1, wherein the detaching is carried out by mechanical, optical, chemical, or thermal means, said means being used alone or in combination.

16. Method according to claim 1, wherein the detaching is carried out by an ion implantation through a face of the initial structure to obtain an embrittled zone, and then by suitable treatment capable of leading to separation of the crystalline part at a level of the embrittled zone.

17. Method according to claim 1, wherein the assembling is carried out with input of material.

18. Method according to claim 1, wherein the assembling is carried out by molecular adhesion.

19. Method according to claim 17, wherein the assembling ends with a thermal treatment to favor inter-atomic bonds at the interface plane.

20. Method according to claim 1, wherein a control of relative positions of the structures during the assembling comprises marking at least one crystalline axis of at least one of the crystalline parts.

21. Method according to claim 1, wherein a control of relative positions of the structures during the assembling is achieved by one or plural set marks borne on an initial structure and refound on the crystalline parts after the detaching.

22. Method according to claim 21, wherein the one or more set marks are formed by one or plural series of graduations.

23. Method according to claim 21, further comprising carrying over the one or more set marks onto other parts of at least one of the initial structure and structures to be assembled.

24. Method according to claim 21, wherein the one or more set marks are formed by at least one technique chosen from among chemical etching, ion beam etching, optical engraving, or mechanical engraving.

25. Method according to claim 21, wherein the one or more set marks include a reference flat.

26. Method according to claim 21, wherein a control of relative positions of the structures during the assembling is carried out by adjusting a position of at least one set mark of one of the structures to be assembled in relation to a position of at least one set mark of another structure to be assembled, by means chosen from among optical, mechanical, acoustical, and hydrodynamic means, the means being used alone or in combination.

27. Method according to claim 1, comprising separating into two parts the initial structure, each of the two parts leading to one of the structures to be assembled.

28. Method according to claim 1, wherein plural separations in the initial structure lead to the structures to be assembled being obtained.

29. Stacked structure obtained according to claim 1, from structures to be assembled made from semi-conductor, superconductor, dielectric, magnetic, metallic materials, the materials being used alone, combined, or mixed.

* * * * *